US009395736B2

(12) United States Patent (10) Patent No.: US 9,395,736 B2
Lai et al. (45) Date of Patent: Jul. 19, 2016

(54) SYSTEM AND METHOD FOR COLLECTING APPLIANCE STANDBY ELECTRICITY-SAVING INFORMATION

(75) Inventors: Tsin Lee Ronnie Lai, New Taipei (TW); Chih-Hong Chen, New Taipei (TW); Li-Wei Chen, legal representative, New Taipei (TW)

(73) Assignee: SGET Corp., Apia (WS)

( * ) Notice: Subject to any disclaimer, the term of this patent is extended or adjusted under 35 U.S.C. 154(b) by 363 days.

(21) Appl. No.: 14/350,759

(22) PCT Filed: Nov. 3, 2011

(86) PCT No.: PCT/CN2011/081760
§ 371 (c)(1),
(2), (4) Date: Apr. 9, 2014

(87) PCT Pub. No.: WO2013/063786
PCT Pub. Date: May 10, 2013

(65) Prior Publication Data
US 2014/0358311 A1 Dec. 4, 2014

(51) Int. Cl.
*G05D 3/12* (2006.01)
*G05F 1/66* (2006.01)
*G01D 4/00* (2006.01)
*H04L 12/12* (2006.01)
*G01R 19/00* (2006.01)
*H04L 12/64* (2006.01)

(52) U.S. Cl.
CPC *G05F 1/66* (2013.01); *G01D 4/002* (2013.01); *G01R 19/0092* (2013.01);
(Continued)

(58) Field of Classification Search
CPC .......................................................... G05F 1/66

USPC ................................................... 700/286–298
See application file for complete search history.

(56) References Cited

U.S. PATENT DOCUMENTS 8,849,596 B2 * 9/2014 Ting ....................... G01D 4/002
307/140
2008/0167756 A1 * 7/2008 Golden .................. G05B 15/02
700/297

(Continued)

FOREIGN PATENT DOCUMENTS

CN 101290514 A 10/2008
CN 102043384 A 5/2011

OTHER PUBLICATIONS

Wood, George, and Mack Newborough. "Dynamic energy-consumption indicators for domestic appliances: environment, behaviour and design." Energy and Buildings 35.8 (2003): pp. 821-841.*

(Continued)

*Primary Examiner* — Satish Rampuria
(74) *Attorney, Agent, or Firm* — Rosenberg, Klein & Lee

(57) ABSTRACT

A system and a method for collecting appliance standby electricity-saving information use a plurality of device-standby power-saving controllers to respectively transmit power-saving messages from a plurality of remote user ends through a data transmission network to a server side for recording and statistics. The system includes a data transmission network, a power-saving information collection server, a server side network connection port, at least a user side network connection device, and at least a device-standby power-saving controller. Each device-standby power-saving controller is electrically connected between an electrical appliance and a power source. Eclectic power energy that is saved is clearly counted and recorded to serve as an integrated power saving encouragement mechanism, which effectively encourages people to use power economizers to put into action of energy saving and carbon reduction thereby indeed achieving the purposes of saving energy and reducing power consumption.

7 Claims, 7 Drawing Sheets

(52) U.S. Cl.
CPC ........... *H04L 12/12* (2013.01); *H04L 12/6418* (2013.01); *Y02B 60/34* (2013.01); *Y02B 70/3266* (2013.01); *Y02B 70/343* (2013.01); *Y02B 90/241* (2013.01); *Y04S 20/242* (2013.01); *Y04S 20/32* (2013.01); *Y04S 20/34* (2013.01)

(56) References Cited

U.S. PATENT DOCUMENTS

| | | | | |
|---|---|---|---|---|
| 2009/0062970 | A1* | 3/2009 | Forbes, Jr. | G01D 4/004 700/295 |
| 2010/0318235 | A1* | 12/2010 | Moss | F24F 11/0086 700/295 |
| 2013/0041605 | A1* | 2/2013 | Ting | G01D 4/002 702/62 |

OTHER PUBLICATIONS

Zeifman, Michael, Craig Akers, and Kurt Roth. "Nonintrusive Appliance Load Monitoring (NIALM) for Energy Control in Residential Buildings: Review and Outlook." IEEE transactions on Consumer Electronics. 2011. pp. 1-12.*

Dianshu, Feng, Benjamin K. Sovacool, and Khuong Minh Vu. "The barriers to energy efficiency in China: Assessing household electricity savings and consumer behavior in Liaoning Province." Energy Policy 38.2 (2010): pp. 1202-1209.*

* cited by examiner

SYSTEM AND METHOD FOR COLLECTING APPLIANCE STANDBY ELECTRICITY-SAVING INFORMATION

BACKGROUND OF THE INVENTION

1. Field of the Invention

The present invention relates to a system and a method for collecting appliance standby electricity-saving information, and in particular for a system featuring power-saving management, automatic operation, enabling transmission and collection of power-saving information for record and statistics.

2. The Related Arts

With increasing maturity of electronic technology, various electrical appliances, from household to office electrical appliances, such as television set, refrigerator, air conditioner, microwave oven, printer, to higher capacity machines commonly installed in laboratories and factories, such as super computer, CNC, MRI, etc, are much more interwoven into daily lives than ever before. For convenience of re-using these devices, manufacturers have designed and users are now habitually keeping these electrical appliances in a standby condition, where these appliances are not actually in use, and the power supply loops between the electrical appliances and the power sources are not actually cut off. Such a practice allows a minor consumption of electrical power by the electrical appliances.

Although the power consumed by a single electrical appliance in a standby condition is fairly small, the total power being consumed by large numbers of standby electrical appliances can become significant, especially on a country wide or global basis. This is wasteful. This depletion of valuable energy leads to higher expenses for utilities in each and every country and is certainly contrary to the now common moral standard that we ought to strive and achieve energy savings any way possible.

It is heretofore known that some electrical appliances are provided with a power interruption device. The power interruption device is connected between a power terminal of an electrical appliance and a power source and comprises of a specific power extractor, a comparator, a timer, and a switch. The specific power extractor functions to set a first reference voltage, which corresponds to a power threshold. The comparator makes comparison between the first reference voltage to a second reference voltage. When the second reference voltage is less than the first reference voltage, the timer counts time to determine if it exceeds a power interruption time. If the counted time exceeds the power interruption time, then the electrical connection between the power terminal of the electrical appliance and the power source is cut off. This serves to achieve a key function—that when the electrical appliance is not in use, the power consumption for the electrical appliance when in standby mode can be reduced, thereby achieving power savings.

However, in certain instances, electrical appliances may be set up in a concealed location or at an elevated location, for performance or aesthetics reasons. This makes activation of the power interruption device very inconvenient. Therefore, wireless control is adopted in combination with the power interruption device, wherein the power interruption device includes a wireless control gate device. The wireless control gate device receives a wireless control signal and generates a conduction signal or a shutoff signal. Depending on the conduction signal, the switch restores the electrical connection between the power terminal and the power source and the shutoff signal cuts off the electrical connection between the power terminal and the power source. In addition to the efficacy of reducing power consumption of an electrical appliance in a standby condition, this arrangement improves easiness of operating the device due to the wireless control.

Further, to cope with the potential risk of fault determination occurring in a power interruption device in electrical appliances, a device-standby power-saving controller that features detection and storage function is available and is capable of not only correctly determining if the device-standby power-saving function be executed but can also identify a potential circuit overloading condition The device-standby power-saving controller, after detecting the activation of a start-up switch, controls a circuit switch to close through a control unit and inspects electrical current of a power circuit with a current detection unit, with the electrical current so detected defined as a standby current. In a predetermined period of time, if the electrical appliance is not set in operation, the control unit controls the circuit switch to open. If the electrical appliance is actuated and turned on to be set in an operating condition within the predetermined period of time, then the current detection unit inspects the electrical current through the power circuit with the electrical current so detected as an operation current. The standby current and the operation current are stored in a storage unit, whereby the standby current and the operation current can be used later to determine if to execute the device-standby power-saving function. This arrangement provides users with an intelligent control function.

However, even though the functions of the power interruption device are getting increasingly diversified and the performance thereof increasingly powerful, the number and willingness of people to invest and install such a power interruption device for the purposes of energy saving is negligible. The market is lacking an integrated mechanism that can drive and invoke more of the general public to take simple steps to save energy.

SUMMARY OF THE INVENTION

In view of the above discussed, an object of the present invention is to provide a system and a method for collecting appliance standby electricity-saving information, wherein the amount of electrical power that is calculated by a power economizer itself is transmitted and collected through a data transmission network system for the purposes of statistics and recording.

The present invention provides a system and a method for collecting appliance standby electricity-saving information, which use a plurality of device-standby power-saving controllers to respectively transmit power-saving messages from a plurality of remote user ends through a data transmission network to a server side for recording and statistics and comprise a data transmission network, a power-saving information collection server, a server side network connection port, at least a user side network connection device, and at least a device-standby power-saving controller, wherein the device-standby power-saving controller comprises a control unit, a storage unit, a current detection unit, a network connection port, a circuit switch, a driver unit that controls the circuit switch to open or close.

The electrical appliance can be operated in one of an operation mode, a standby mode, and a shutdown mode. The control unit is operated such that after the electrical appliance is set in the standby mode for a predetermined period of time, the control unit controls, via the driver unit, the circuit switch to open. With the circuit switch being opened, the control unit detects a time interval of power interruption for the electrical appliance resuming the operation mode and calculates and generates a power-saving message based on the power interruption time interval and a standby current value. The power-saving message generated by the device-standby power-saving controllers is transmitted through the network connection port, the user side network connection device, the data transmission network, and the server side network connection port to the power-saving information collection server The storage unit stores an operation current value and a standby current value. When the circuit switch is closed and the electrical appliance is in operation in the operation mode, the current detection unit detects an electrical current flowing from the power source through the power circuit to the electrical appliance, which is defined as the operation current value. When the circuit switch is closed and the electrical appliance is in the standby mode, the current detection unit detects an electrical current flowing from the power source through the power circuit to the electrical appliance, which is defined as the standby current value. When the control unit detects, via the current detection unit, the electrical current flowing through the power circuit is of the standby current value, with a lapse of the predetermined period of time, the driver unit controls the circuit switch to open.

The system and method for collecting power-saving messages of electrical appliances so designed allow the amount of energy that is saved to be clearly counted and recorded to serve as an integrated power saving encouragement mechanism, which effectively encourages people to use power economizers to put into action of energy saving and carbon reduction thereby indeed achieving the purposes of saving energy and reducing power consumption.

DETAILED DESCRIPTION OF THE PREFERRED EMBODIMENTS

Figure 1:
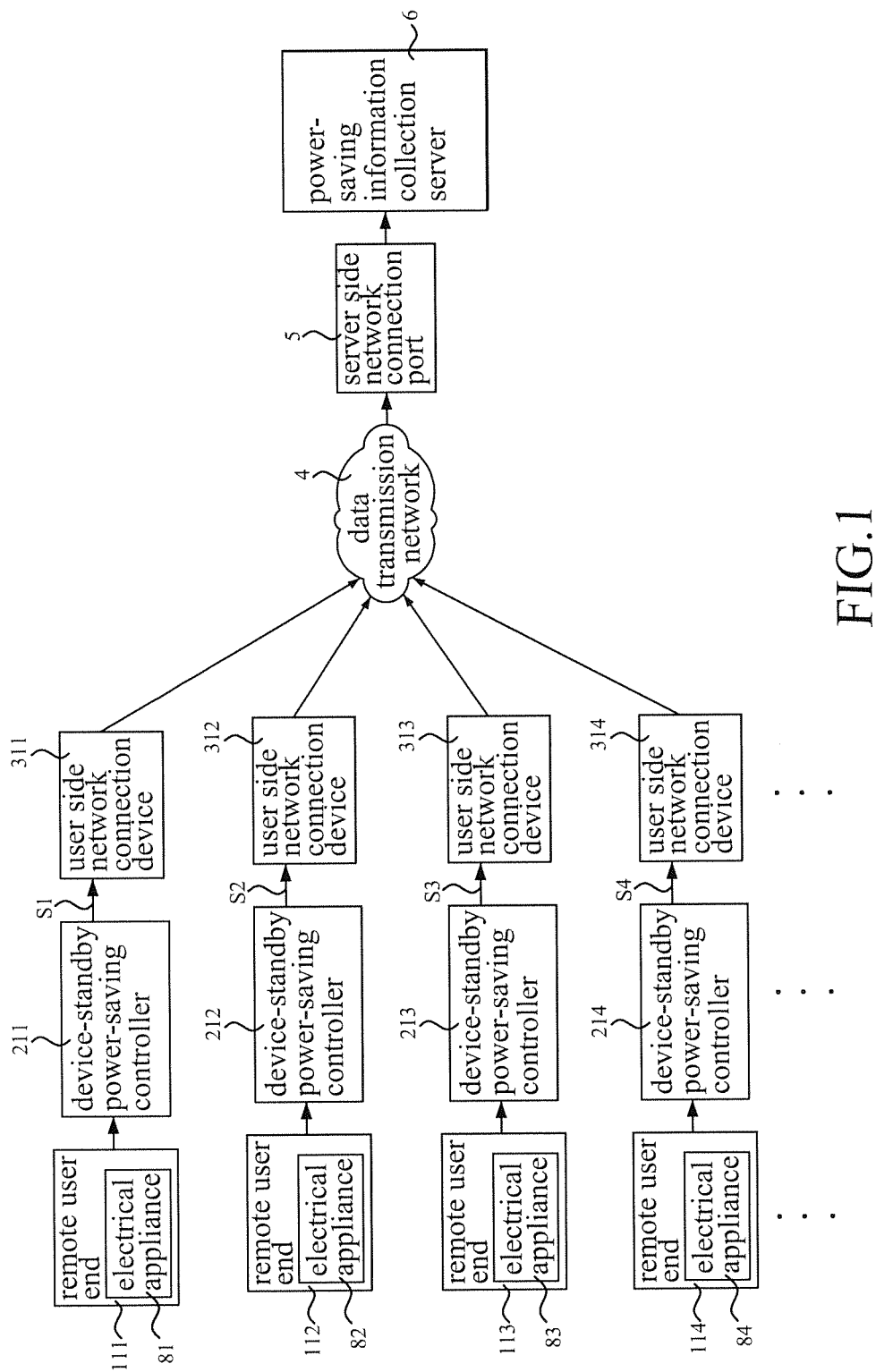
FIG. 1 is a schematic view illustrating a system for collecting appliance standby electricity-saving information in accordance with a first embodiment of the present invention.
Figure 2:
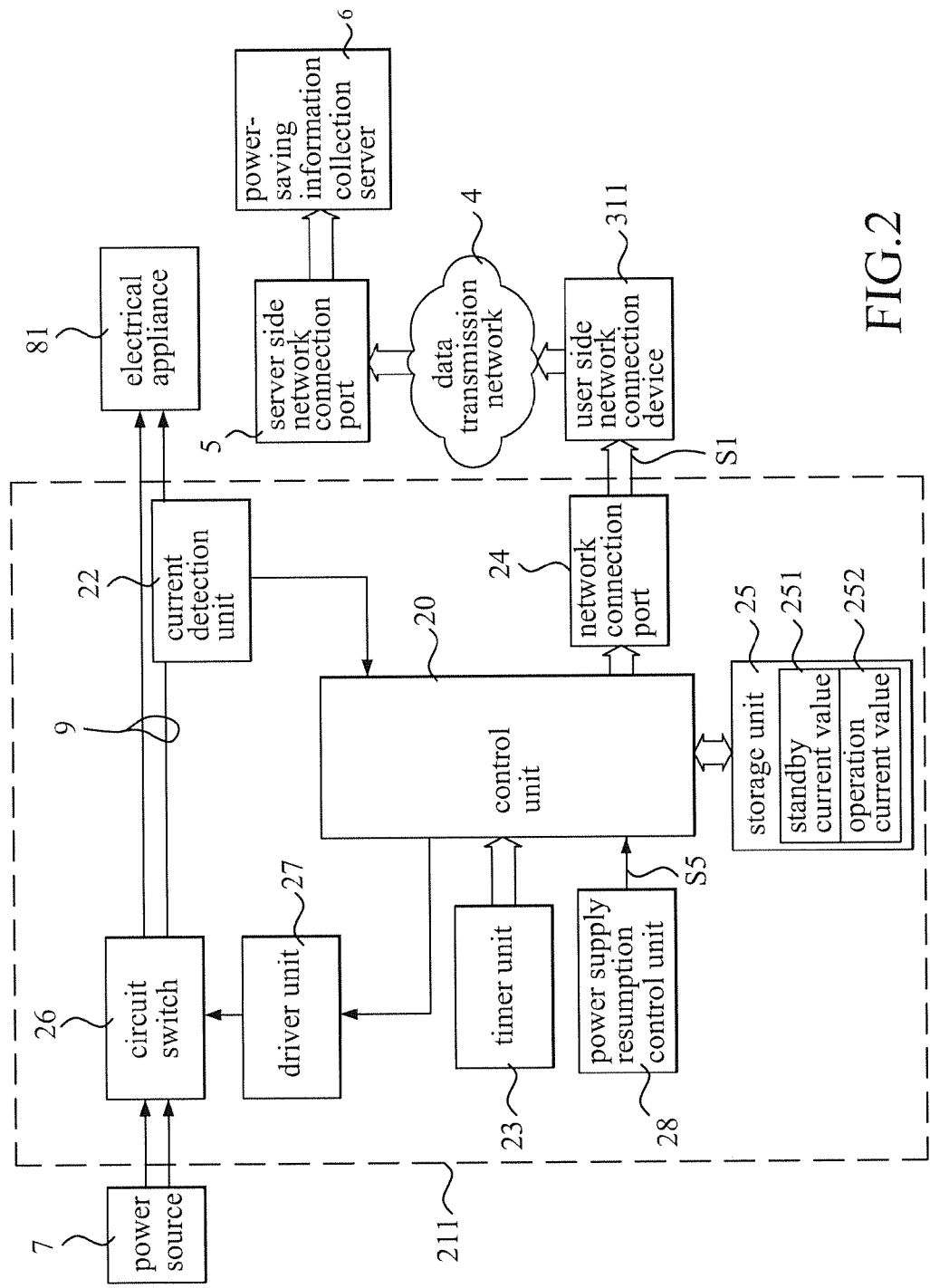
FIG. 2 is a block diagram illustrating the system according to the present invention arranged between a power source and an electrical appliance.

Referring to FIGS. 1 and 2, the present invention provides a system and a method for collecting appliance standby electricity-saving information of which the general inventive idea is using a plurality of device-standby power-saving controllers (211-214) to respectively transmit power-saving messages from a plurality of remote user ends (111-114) through a data transmission network 4 to a server side for recording and statistics, wherein the device-standby power-saving controllers (211-214) and a power circuit 9 are electrically connected between an electrical appliance 81 and a power source 7.

The system and the method for collecting appliance standby electricity-saving information according to the present invention comprise: a data transmission network 4; a power-saving information collection server 6, which is connected to the data transmission network 4; a server side network connection port 5, which is connected to the power-saving information collection server 6 and the data transmission network 4; at least a user side network connection device (311-314), which is connected to the data transmission network 4; at least a device-standby power-saving controller (211-214). The device-standby power-saving controller 211 comprises a control unit 20, a storage unit 25, a current detection unit 22, a network connection port 24, a circuit switch 26, and a driver unit 27 that controls the circuit switch to open or close. The network connection port 24 of the device-standby power-saving controller is connected to the user side network connection device 311. The circuit switch 26 and the current detection unit 22 are connected between a power source 7 and at least an electrical appliance 81 that is arranged at the user side.

In the system according to the present invention, the electrical appliance can be operated in one of an operation mode, a standby mode, and a shutdown mode. The control unit 20 is operated such that after the electrical appliance 81 is set in the standby mode for a predetermined period of time, the control unit 20 controls, via the driver unit 27, the circuit switch 26 to open; with the circuit switch 26 being opened, the control unit 20 detects a time interval of power interruption for the electrical appliance 81 resuming the operation mode and calculates and generates a power-saving message S1 based on the power interruption time interval and a standby current value 251. The power-saving message S1 generated by the device-standby power-saving controllers 211 is transmitted through the network connection port 24, the user side network connection device 311, the data transmission network 4, and the server side network connection port 5 to the power-saving information collection server 6. The storage unit 25 stores an operation current value 252 and the standby current value 251. When the circuit switch 26 is closed and the electrical appliance 81 is in operation in the operation mode, the current detection unit 22 detects an electrical current flowing from the power source 7 through the power circuit 9 to the electrical appliance 6, which is defined as the operation current value 252; and when the circuit switch 26 is closed and the electrical appliance 81 is in the standby mode, the current detection unit 22 detects an electrical current flowing from the power source 7 through the power circuit 9 to the electrical appliance 81, which is defined as the standby current value 251. When the control unit 20 detects, via the current detection unit 22, the electrical current flowing through the power circuit 9 is of the standby current value 251, with a lapse of the predetermined period of time, the driver unit 27 controls the circuit switch 26 to open.

Figure 3:
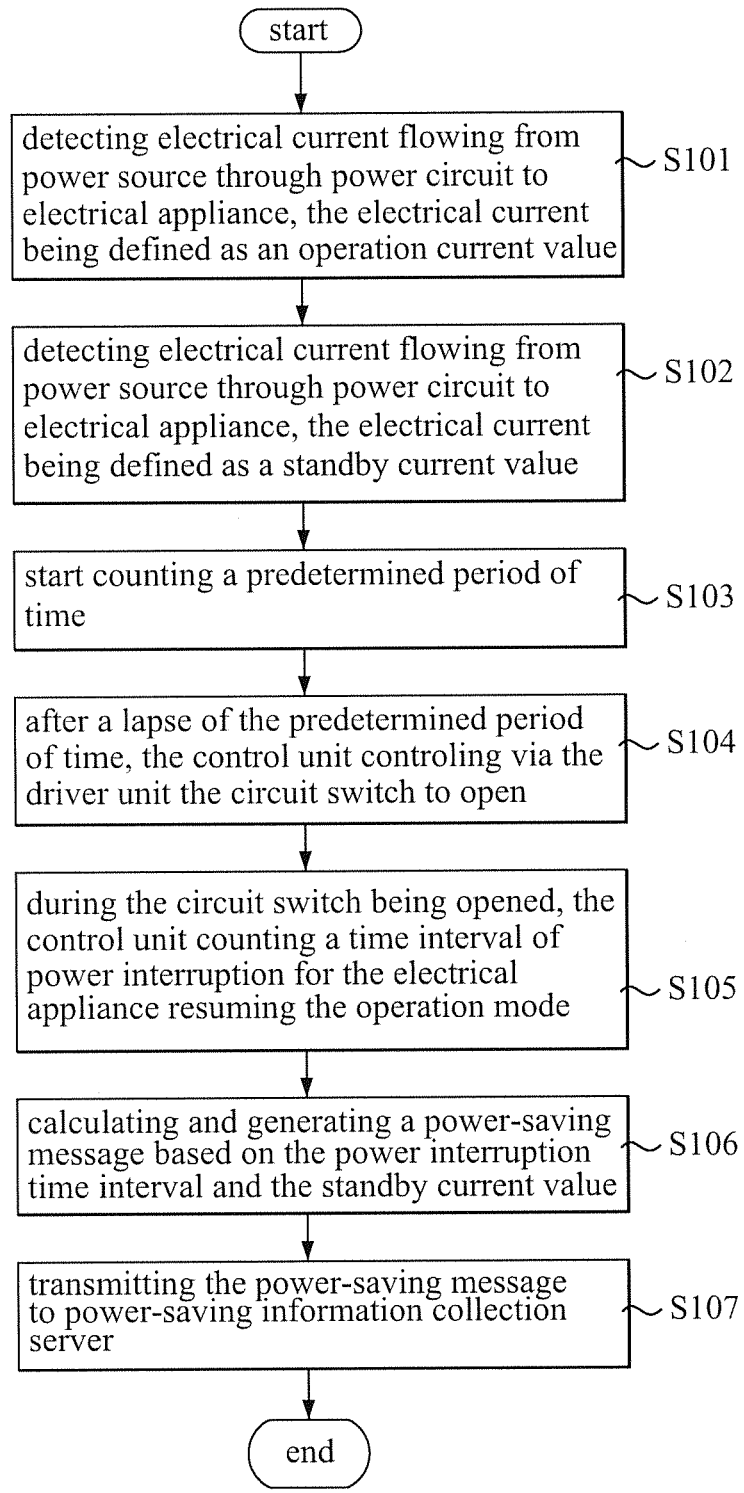
FIG. 3 is a flow chart illustrating the method of the system according to the present invention.

Referring to FIGS. 1-3, the method for collecting device-standby power-saving information of an electrical appliance at the user side according to the present invention is that at least a device-standby power-saving controller 211 transmits a message of power saving from at least a remote user end 111 to a power-saving information collection server 6. The device-standby power-saving controller 211 comprises a control unit 20, a storage unit 25 connected to the control unit, a current detection unit 22, a circuit switch 26, and a driver unit 27 controlling the circuit switch to open or close. The circuit switch 26 and the current detection unit 22 are connected between a power source 7 and at least an electrical appliance 81 that is arranged at the user side.

The electrical appliance 81 can be operated in one of an operation mode, a standby mode, and a shutdown mode. The method comprises the following steps: When the circuit switch 26 is closed and the electrical appliance 81 is in operation in the operation mode, the current detection unit 22 detects an electrical current flowing from the power source 7 through the power circuit 9 to the electrical appliance 81, which is defined as an operation current value 252 (Step S101); when the circuit switch 26 is closed and the electrical appliance 81 is in the standby mode, the current detection unit 22 detects an electrical current flowing from the power source 7 through the power circuit 9 to the electrical appliance 81, which is defined as a standby current value 251 (Step S102); when the control unit 20 detects, via the current detection unit 22, an electrical current flowing through the power circuit 9 that is of the standby current value 251, a timer unit 23 starts counting a predetermined period of time (Step S103); after a lapse of the predetermined period of time, the control unit 20 controls, via the driver unit 27, the circuit switch 26 to open (Step S104); during the circuit switch 26 being opened, the control unit 20 counts a time interval of power interruption for the electrical appliance 81 resuming the operation mode (Step S105); the control unit 20 calculates and generates a power-saving message S1 based on the power interruption time interval and the standby current value 251 (Step S106); and the power-saving message S1 is transmitted to the power-saving information collection server 6 (Step S107).

Figure 4:
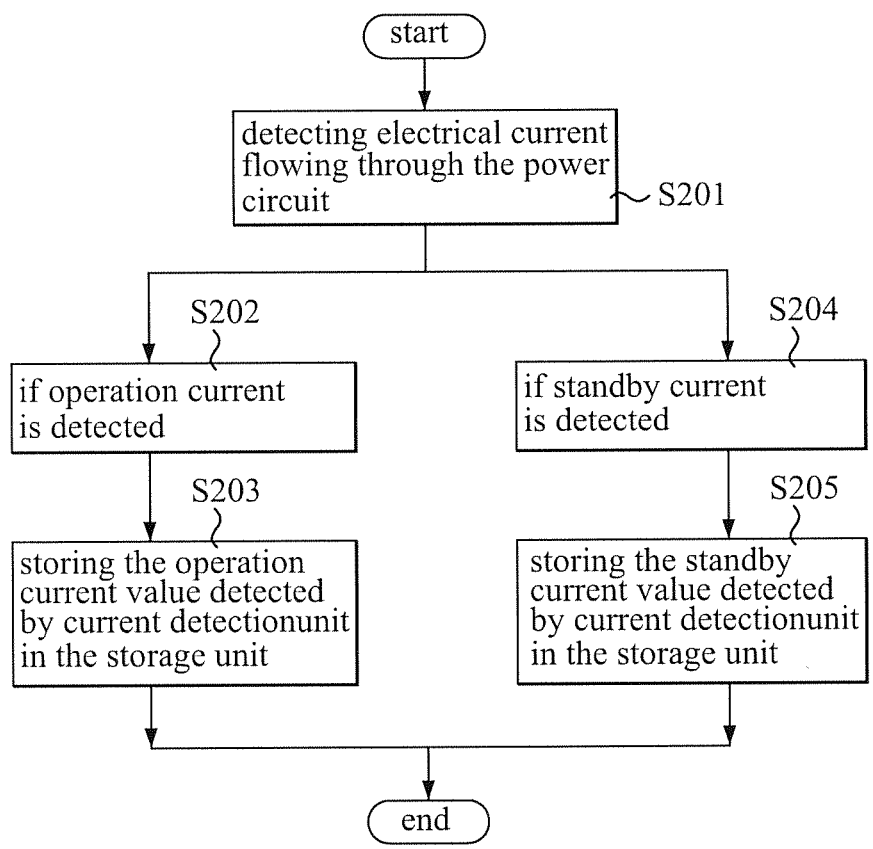
FIG. 4 is a flow chart illustrating a process of timing for automatic detection of the system according to the present invention.

Referring to FIG. 4, the method for collecting device-standby power-saving information of an electrical appliance at the user side according to the present invention is such that in the detection of electrical current flowing through the power circuit 9 (Step S201), if the current detection unit 22 detects the operation current (Step S202), then the operation current value 252 detected by the current detection unit 22 is stored in the storage unit 25 (Step S203) and if the current detection unit 22 detects the standby current (Step S204), the standby current value 251 detected by the current detection unit 22 is stored in the storage unit 25 (Step S205).

Figure 5:
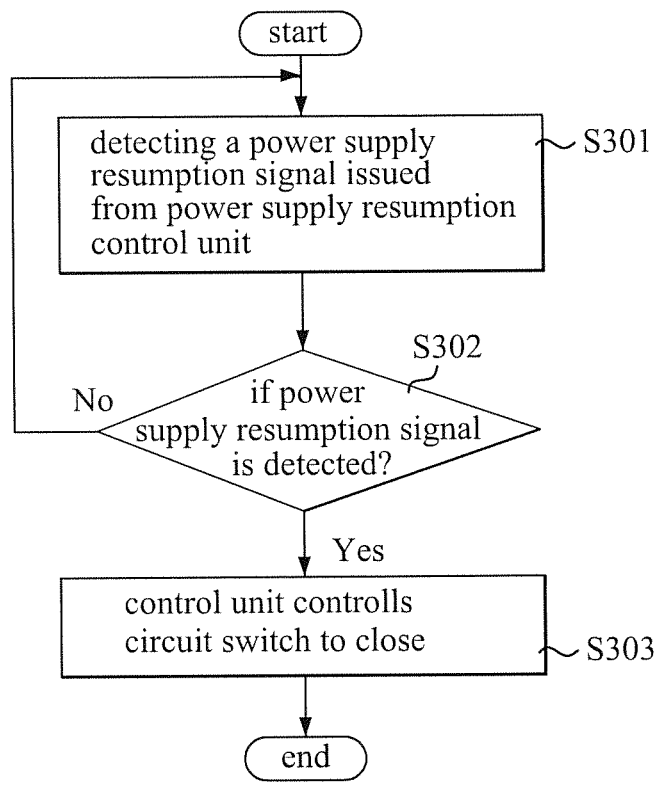
FIG. 5 is a flow chart illustrating a process of resuming power supply after detection of power interruption according to the present invention.

Referring to FIG. 5, the method for collecting device-standby power-saving information of an electrical appliance at the user side according to the present invention further comprises, after the completion of power saving step, the control unit 20 detecting a power supply resumption signal S5 issued from a power supply resumption control unit 28 (Step S301), whereby when the control unit 20 detects the power supply resumption signal S5 (Step S302), the control unit 20 controls, via the driver unit 27, the circuit switch 26 to close (Step S303).

Figure 6:
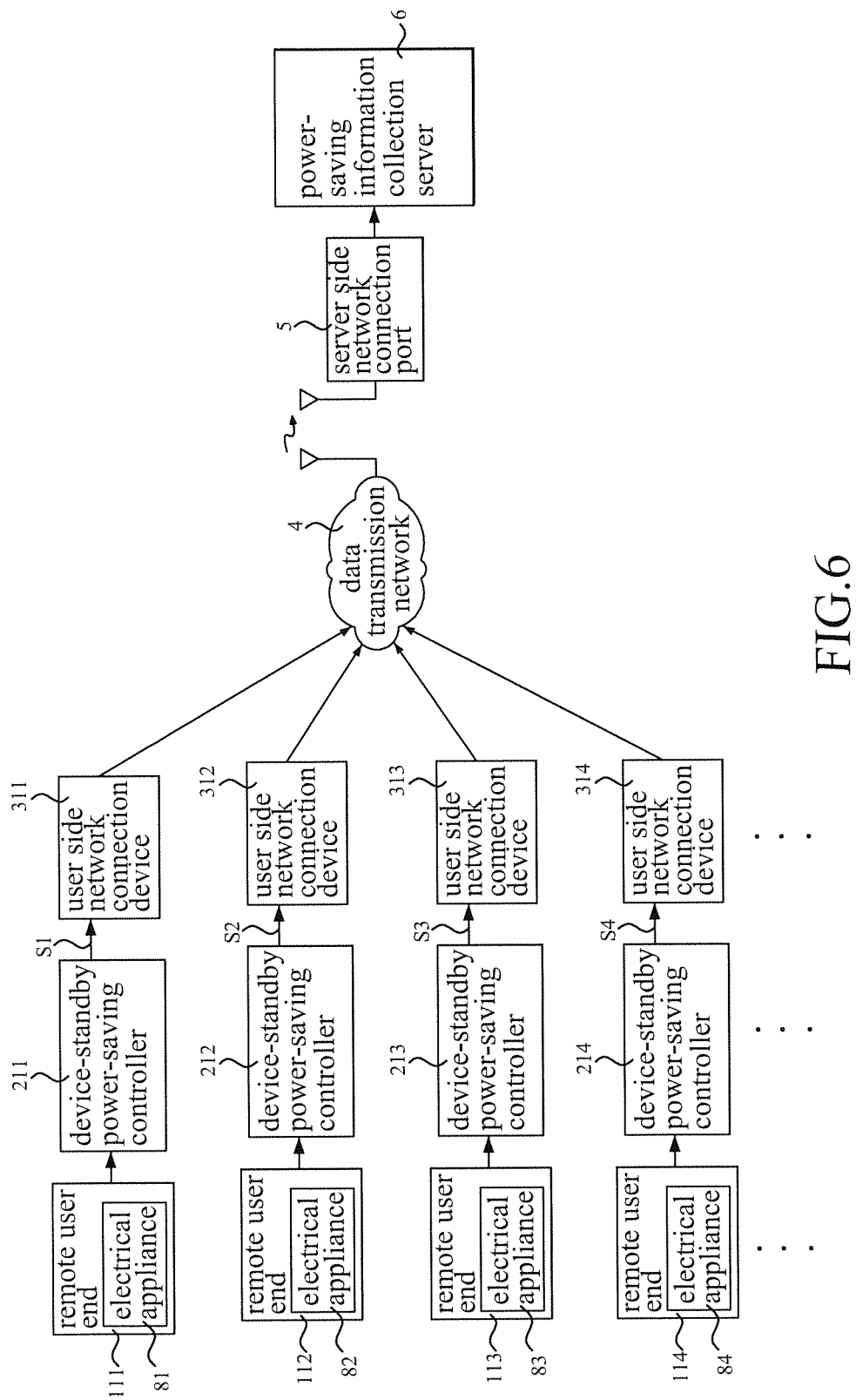
FIG. 6 is a schematic view illustrating a system for collecting appliance standby electricity-saving information in accordance with a second embodiment of the present invention.
Figure 7:
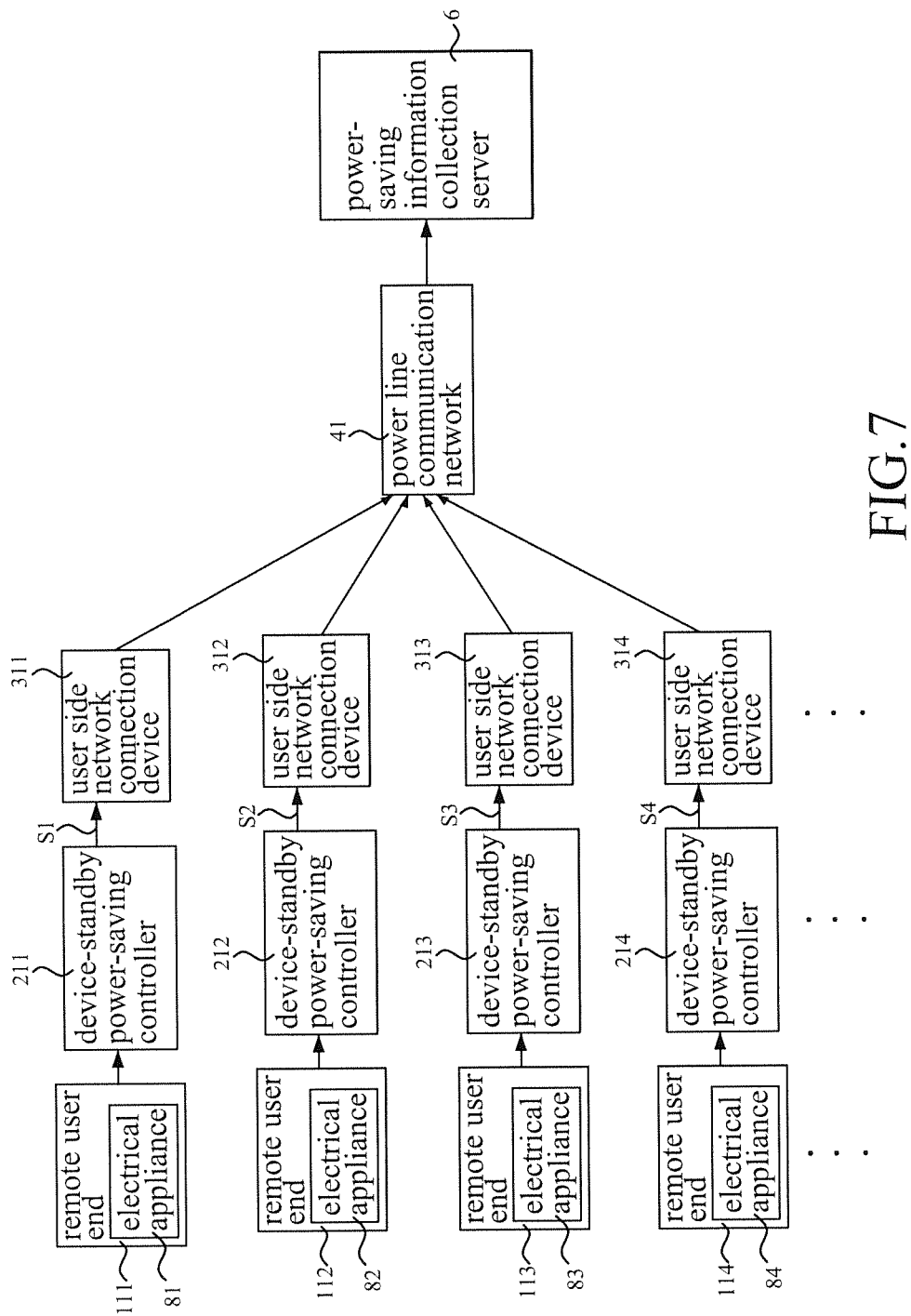
FIG. 7 is a schematic view illustrating a system for collecting appliance standby electricity-saving information in accordance with a third embodiment of the present invention.

Referring to FIG. 6, a schematic view is given to illustrate a system for collecting appliance standby electricity-saving information according to a second embodiment of the present invention. In addition to using the Internet or a telephone network to serve as the data transmission network 4, it is possible to apply wireless communication, but the present invention is not limited thereto. Referring to FIG. 7, a schematic view is given to illustrate a system for collecting appliance standby electricity-saving information according to a third embodiment of the present invention. In addition to using the Internet, a telephone network, or wireless communication to serve as the data transmission network 4, it is possible to apply a power line communication network 41. The power line communication network 41 comprises a controller, a signal modulation and demodulation circuit, and a power source coupling circuit. The remote user end 111 is operated such that the power-saving message S1 that is obtained through calculation made by the device-standby power-saving controller 211 is subjected to a process of power source coupling and modulation and demodulation and transmitted through a power line to the power-saving information collection server 6.

The embodiments that are illustrated in the disclosure and the drawings are provided for explanation of switching among functional modes of circuit, which is apparent to those skilled in the art. The system and the method for collecting appliance standby electricity-saving information according to the present invention is indeed of novelty, inventive step, and industrial utilization and thus, the present invention completely complies with the requirements of Patent Laws. The embodiments illustrated above are considered only an illustrative explanation of preferred embodiments of the present invention and those skilled in the art may readily envisage various modifications and variations based on the above description of embodiments of the present invention. However, all these modifications and variations made on the basis of the embodiments of the present invention are considered within the inventive spirits of the present invention and the scope of patent protection defined in the appended claims.

What is claimed is:

1. A system for collecting a standby electricity-saving information of an electrical appliance, comprising:
    a data transmission network;
    a power-saving information collection server, which is connected to the data transmission network;
    a server side network connection port, which is connected between the power-saving information collection server and the data transmission network;
    at least a user side network connection device, which is connected to the data transmission network;
    at least a device-standby power-saving controller, which comprises a control unit, a storage unit connected to the control unit, a current detection unit, a network connection port, a circuit switch, a driver unit that controls the circuit switch to open or close, the device-standby power-saving controller being connected via the network connection port to the control unit and the user side network connection device, the circuit switch and the current detection unit being connected between a power source and the electrical appliance that is arranged at the user side;
    wherein the electrical appliance is operated in one of an operation mode, a standby mode, and a shutdown mode, the control unit being operated so that after the electrical appliance is set in the standby mode for a predetermined period of time, the control unit controls, via the driver unit, the circuit switch to open; and
    wherein with the circuit switch being opened, the control unit detects a time interval of power interruption for the electrical appliance resuming the operation mode and calculates and generates a power-saving message based on the power interruption time interval and a standby current value, the power-saving message generated by the device-standby power-saving controllers being transmitted through the network connection port, the user side network connection device, the data transmission network, and the server side network connection port to the power-saving information collection server.

2. The system according to claim 1, wherein the storage unit stores an operation current value and the standby current value, and wherein when the circuit switch is closed and the electrical appliance is in operation in the operation mode, the current detection unit detects an electrical current flowing from the power source through the power circuit to the electrical appliance, which is defined as the operation current value; and when the circuit switch is closed and the electrical appliance is in the standby mode, the current detection unit detects an electrical current flowing from the power source through the power circuit to the electrical appliance, which is defined as the standby current value;

when the control unit detects, via the current detection unit, the electrical current flowing through the power circuit is of the standby current value, with a lapse of the predetermined period of time, the driver unit controls the circuit switch to open.

3. The system according to claim 1, wherein the data transmission network comprises one of Internet, a telephone network, wireless communication, and a power line communication network.

4. A method for collecting a standby electricity-saving information of an electrical appliance, at least a device-standby power-saving controller transmitting a power saving message from at least a remote user end to a power-saving information collection server, the device-standby power-saving controller comprising a control unit, a storage unit connected to the control unit, a current detection unit, a circuit switch, and a driver unit controlling the circuit switch to open or close, the circuit switch and the current detection unit being connected between a power source and at least an electrical appliance that is arranged at the user side, the electrical appliance being operated in one of an operation mode, a standby mode, and a shutdown mode, the method comprising the following steps:

(a) when the circuit switch is closed and the electrical appliance is operated in the operation mode, the current detection unit detecting an electrical current flowing from the power source through the power circuit to the electrical appliance, which is defined as an operation current value;

(b) when the circuit switch is closed and the electrical appliance is operated in the standby mode, the current detection unit detects an electrical current flowing from the power source through the power circuit to the electrical appliance, which is defined as a standby current value;

(c) when the control unit detects, via the current detection unit, an electrical current flowing through the power circuit that is of the standby current value, a timer unit starting counting a predetermined period of time;

(d) after a lapse of the predetermined period of time, the control unit controlling, via the driver unit, the circuit switch to open;

(e) during the circuit switch being opened, the control unit counting a time interval of power interruption for the electrical appliance resuming the operation mode;

(f) the control unit calculating and generating a power-saving message based on the power interruption time interval and the standby current value; and (g) the power-saving message being transmitted to the power-saving information collection server.

5. The method according to claim 4, wherein Step (a) further comprises a step that the operation current value detected by the current detection unit is stored in the storage unit; and Step (b) further comprises a step that the standby current value detected by the current detection unit is stored in the storage unit.

6. The method according to claim 4, wherein the power-saving message is transmitted through one of Internet, a telephone network, wireless communication, and a power line communication network to the power-saving information collection server.

7. The method according to claim 4, further comprising, after Step (g), the following steps:

(h) the control unit detecting a power supply resumption signal; and (i) when the control unit detects the power supply resumption signal, the control unit controlling, via the driver unit, the circuit switch to close.

* * * * *